(12) United States Patent
Dungan

(10) Patent No.: US 12,543,597 B2
(45) Date of Patent: Feb. 3, 2026

(54) PARTITIONED OVERLAPPED COPPER-BONDED INTERPOSERS

(71) Applicant: Avago Technologies International Sales Pte. Limited, Singapore (SG)

(72) Inventor: Thomas Dungan, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 679 days.

(21) Appl. No.: 17/872,371

(22) Filed: Jul. 25, 2022

(65) Prior Publication Data
US 2024/0030209 A1 Jan. 25, 2024

(51) Int. Cl.
| | |
|---|---|
| *H01L 25/18* | (2023.01) |
| *H01L 23/00* | (2006.01) |
| *H01L 23/498* | (2006.01) |
| *H01L 23/538* | (2006.01) |

(52) U.S. Cl.
CPC ........ *H01L 25/18* (2013.01); *H01L 23/49816* (2013.01); *H01L 23/5385* (2013.01); *H01L 24/05* (2013.01); *H01L 24/08* (2013.01); *H01L 2224/05647* (2013.01); *H01L 2224/08225* (2013.01)

(58) Field of Classification Search
CPC ... H01L 23/49816; H01L 24/05; H01L 24/08; H01L 23/49838; H01L 23/5386; H01L 25/18; H01L 2224/05647; H01L 23/49833; H01L 25/0655
See application file for complete search history.

(56) References Cited

U.S. PATENT DOCUMENTS

| | | | |
|---|---|---|---|
| 8,841,752 B1 | 9/2014 | Chaware et al. | |
| 9,066,424 B2 | 6/2015 | Yang et al. | |
| 9,591,742 B2 | 3/2017 | Murayama et al. | |
| 2012/0015480 A1 | 1/2012 | Hughes et al. | |
| 2012/0264320 A1 | 10/2012 | Parrish et al. | |
| 2014/0177626 A1 | 6/2014 | Thottethodi et al. | |
| 2017/0062383 A1* | 3/2017 | Yee .................. | H01L 24/20 |
| 2019/0341368 A1 | 11/2019 | Hu et al. | |
| 2020/0312826 A1 | 10/2020 | Jung et al. | |
| 2020/0395313 A1 | 12/2020 | Mallik et al. | |
| 2021/0043571 A1 | 2/2021 | Hou et al. | |
| 2021/0111113 A1 | 4/2021 | Martorell et al. | |
| 2021/0202389 A1* | 7/2021 | Hsieh ................ | H01L 24/96 |
| 2021/0366814 A1 | 11/2021 | Hou et al. | |
| 2023/0314702 A1* | 10/2023 | Yu ..................... | H01L 24/23 |
| | | | 385/14 |
| 2023/0335519 A1* | 10/2023 | Chen ................. | H01L 25/105 |
| 2023/0402438 A1* | 12/2023 | Liu .................... | H01L 23/49838 |
| 2024/0021528 A1* | 1/2024 | Shih ................... | H01L 25/50 |

(Continued)

*Primary Examiner* — Mamadou L Diallo
(74) *Attorney, Agent, or Firm* — Quarles & Brady LLP

(57) ABSTRACT

An interposer, and integrated circuit including an interposer, has a lower surface adapted for bump mounting and an upper surface adapted for copper bonding. An interposer layer includes active interposers and passive interposers. Bridges connect interposers in the interposer layer to produce a functionally large interposer from smaller interposer dies. A core may overlap more than one interposer in the interposer layer. Active interposers are disposed around the edge of the core with passive interposers beneath the core to facilitate heat dissipation.

17 Claims, 11 Drawing Sheets

(56) References Cited

U.S. PATENT DOCUMENTS

| | | | |
|---|---|---|---|
| 2024/0021577 A1* | 1/2024 | Jung | H01L 23/3135 |
| 2024/0021591 A1* | 1/2024 | Lee | H01L 23/3135 |
| 2024/0027494 A1* | 1/2024 | Tong | G01R 1/07378 |
| 2024/0429865 A1* | 12/2024 | Sundaram Priya | G06F 1/12 |

* cited by examiner

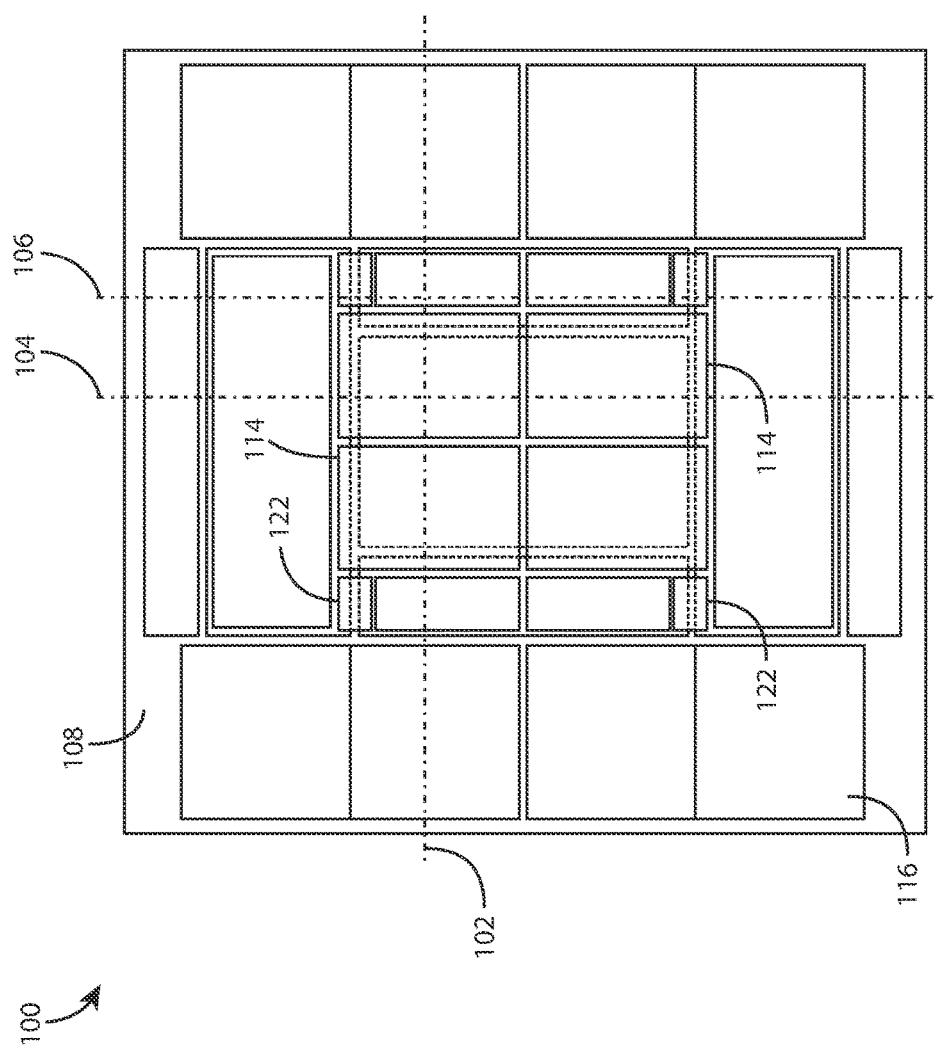

PARTITIONED OVERLAPPED COPPER-BONDED INTERPOSERS

BACKGROUND

Processor modules including integrated circuit processors and memory are difficult and expensive to scale up. Existing mounting techniques offer insufficient density or utilize dies too large to efficiently manufacture at a higher density. Interposers with vias are used to establish connectivity between bump mounted solder components and copper-to-copper mounted integrated circuit components.

As processor modules increase in capability, more integrated circuit processors and logic circuitry is added, increasing overall size and complexity. Existing interposers are limited in size by existing manufacturing techniques. Interposers large enough to accommodate the added circuitry require large dies that are expensive and inefficient to manufacture due to low yield.

Large integrated circuits can be decomposed into multiple dies to increase capacity and improve yield with the interfaces across the partitions implemented over solder bumps. However, solder bumps (e.g., microbumps) are limited by manufacturing and reliability considerations to much larger pitches compared to copper-to-copper bonding.

SUMMARY

In one aspect, embodiments of the inventive concepts disclosed herein are directed to an interposer, and integrated circuit including an interposer, with a lower surface adapted for bump mounting and an upper surface adapted for copper bonding. An interposer layer includes active interposers and passive interposers.

In a further aspect, bridges connect interposers in the interposer layer to produce a functionally large interposer from smaller interposer dies.

In a further aspect, a core overlaps more than one interposer in the interposer layer. Active interposers may be disposed around the edge of the core with passive interposers beneath the core to facilitate heat dissipation.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which:

FIG. 1A shows a top view of a processor module according to an exemplary embodiment;

DETAILED DESCRIPTION

Figure 1B:
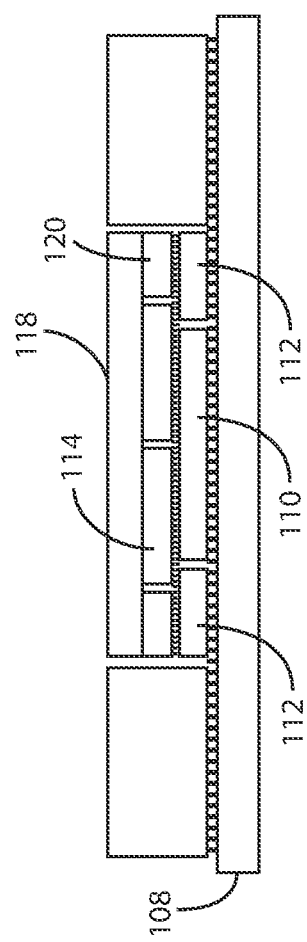
FIG. 1B shows a front cross-sectional view of the processor module in FIG. 1A.

Before explaining various embodiments of the inventive concepts disclosed herein in detail, it is to be understood that the inventive concepts are not limited in their application to the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Also, while various components may be depicted as being connected directly, direct connection is not a requirement. Components may be in data communication with intervening components that are not illustrated or described. Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in at least one embodiment" in the specification does not necessarily refer to the same embodiment. Embodiments of the inventive concepts disclosed may include one or more of the features expressly described or inherently present herein, or any combination or sub-combination of two or more such features.

Broadly, embodiments of the inventive concepts disclosed herein are directed to an interposer, and/or an integrated circuit including an interposer, with a lower surface adapted for bump mounting and an upper surface adapted for copper bonding. An interposer layer includes active interposers and passive interposers. Bridges connect interposers in the interposer layer to produce a functionally large interposer from smaller interposer dies. A core may overlap more than one interposer in the interposer layer. Active interposers are disposed around the edge of the core with passive interposers beneath the core to facilitate heat dissipation.

Figure 1C:
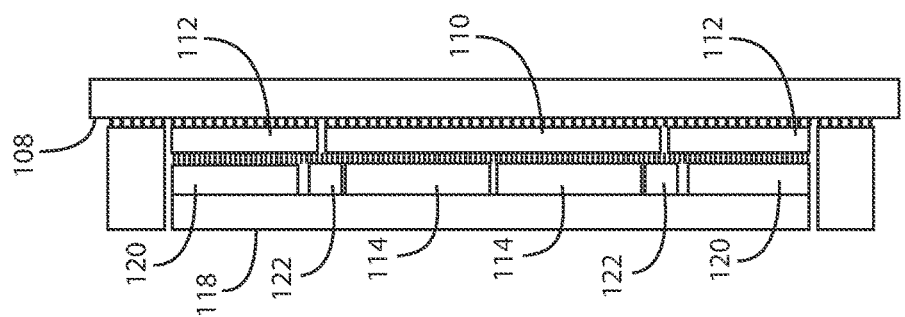
FIG. 1C shows a side cross-sectional view of the processor module in FIG. 1A.
Figure 1D:
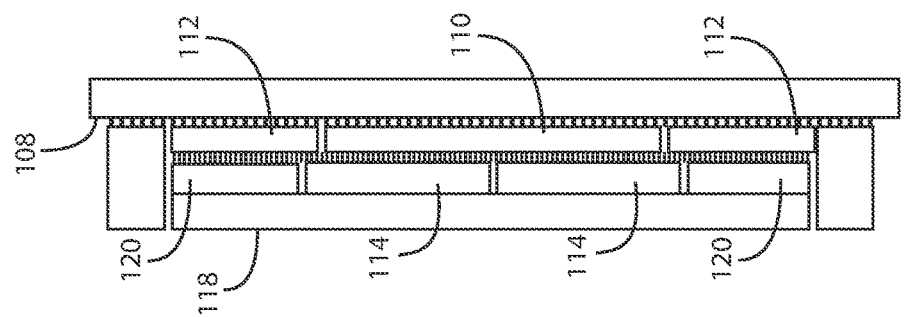
FIG. 1D shows a side cross-sectional view of the processor module in FIG. 1A.

Referring to FIGS. 1A-1D, top and cross-sectional views of a processor module 100 according to an exemplary embodiment are shown. A front cross-sectional view shown in FIG. 1B is defined along a first plane 102; a first side cross-sectional view shown in FIG. 1C is define along a second plane 104; and a second side cross-sectional view shown in FIG. 1D is defined along a third plane 106.

The processor module 100 includes interposers 110, 112 that form an interposer layer. Each interposer 110, 112 has a surface adapted for bump mounting such as via solder microbumps or the like, and a surface adapted for copper bonding, including hybrid copper bonding where both a planarized dielectric layer and copper connection points are bonded in the same plane. Hybrid copper bonding, as distinct from microbump bonding, creates an interface between surfaces (e.g., surfaces with corresponding dielectric and active copper portions). For example, in some embodiments, a dielectric (e.g., an oxide such as silicon dioxide) and active copper in each surface are bonded in a plane under elevated temperature and pressure such that the copper (or other material, e.g., Ag, InAg, or copper alloys thereof and the like) may expand more than the oxide in order to form a pressure bond. In at least one embodiment, the surfaces are bonded together such that dielectric is bonded to dielectric (e.g., an oxide such as silicon dioxide) and copper is bonded to copper, creating a structure that essentially acts like one die. The bond is a room temperature bond between two clean oxide surfaces. Adaptation for bump mounting may include chemically treating the surface to receive solder, forming contact pads, applying solder bumps to contact pads, or the like. Adaptation for copper bonding may include embedded metal recesses, or process steps such as depositing both a dielectric material and copper, planarizing the surface via grinding, or the like.

Hybrid copper bonding increases density of the interconnection pitches as compared to microbumps (40 microns scale to less than 10 microns). Interposers 110, 112 may be bump mounted to a mother interposer 108 (such as an FR4 material) that may be a pitch and manufacturing scale suitable for thicker, larger area dies. It may be appreciated that the mother interposer 108 comprises any substrate layer that provides pitch translation and electronic connectivity between the interposers 110, 112. Additional layers of pitch translation may by incorporated according to the principles described herein.

The interposers 110, 112 define arrays of through vias to create power and signal connectivity, and routing capability between and among bump mounts and copper bond contacts. Copper bonding offers a higher density connection area for smaller, denser processing cores 114 such as a central processing unit core or other integrated circuitry. A higher density connection area enables scaling-up of capability as compared to existing processor modules. By replacing the solder connections to a chip-last interposer (e.g., silicon, organic, or organic with embedded die) with copper bonding to a silicon interposer, the connection density between the interposers 110, 112 and corresponding logic circuitry can be significantly increased, e.g., by one or two orders of magnitude. Increased density enables much denser, higher-bandwidth, lower-power partitioning of the active circuits.

For processing cores 114 or groupings of processing cores 114 beyond a certain size, existing interposers 110, 112 are not large enough to service all of the required power need and data routing. Existing processor modules may stitch together interposers 110, 112 at their respective edges, or employ expensive, specialized manufacturing technology to produce larger interposer dies. In at least one embodiment, multiple interposers 110, 112 are disposed in a layer. One or more interposer bridges 122 span two interposers 110, 112, connected to each interposer 110, 112 at their corresponding copper bonding surfaces. The interposer bridges 122 allow for signal continuity between the corresponding interposers 110, 112. Interposer bridges 122 may be active or passive, and may be embodied in any die, outside the interposer layer, that provides signal continuity between interposers 110, 112.

In at least one embodiment, interposers 110, 112 in the interposer layer are disposed such that processing cores 114 or memory elements 116 or both overlap portions of more than one interposer 110, 112. For example, a processing core 114 may be primarily disposed above a first interposer 110, 112 while overlapping a second interposer 110, 112 along at least one edge. Each of the first and second interposer 110, 112 is copper bonded to the corresponding processing core 114. The processing core 114 is in electronic communication with both interposers 110, 112, and the interposers 110, 112 are in electronic communication with each other via the processing core 114. It may be appreciated that "electronic communication" encompasses a direct or indirect physical connection that enables both sending and receiving signals to and from an active interposer, as well as transferring signals via a passive interposer, even when such signals are not actually being sent or received.

In at least one embodiment, the interposer layer comprises passive interposers 110 (including passive components such as vias and capacitors) that provide power and signal connectivity between components, and active interposers 112 (embodied for example in 7 nm, active interposer dies including transistors) that also include some logic circuitry. Processor modules 100 may be limited by the amount of heat they can dissipate. Both processing cores 114 and active interposers 112 produce heat as a waste product of the electronic operations of their corresponding logic circuitry. Therefore, in at least one embodiment, processing cores 114 are disposed above passive interposers 110 to maintain heat production per unit area below a predefined threshold. Active interposers 112 are disposed where they will not be covered by other processing elements.

Small interposer dies have superior manufacturing efficiency as compared to larger interposer dies. Separating the interposer layer into a set of interposer dies that overlap with a top die facilitates manufacture by increasing manufacturing efficiency and electronically connecting the interposer dies without stitching. Instead of stitches, communication between different active interposer dies is be implemented with passive interposer bridges 122. Likewise, interposers 110, 112 communicate vertically with the processing cores 114 or other logic element in overlapping areas.

Heat dissipation in processor modules 100 is facilitated by blank dies 118, 120 (e.g., dies without electronic function that may provide a space filling function, a heat transfer function, or the like) disposed to carry heat from active components to a heat sink. In at least one embodiment, where the interposer layer includes passive interposers 110, and active interposers 112, the processor module 100 may also include intermediary blank dies 120 disposed above portions of active interposers 112 not otherwise covered by other components. The intermediary blank dies 120 may carry heat to a general blank die 118.

In at least one embodiment, a space above an active interposer 112 may include a component with some logic circuitry. In such embodiment, the logic circuitry is designed such that the heat production of the logic circuitry and corresponding active interposer 112 per unit area remains below the predefined threshold.

Figure 2:
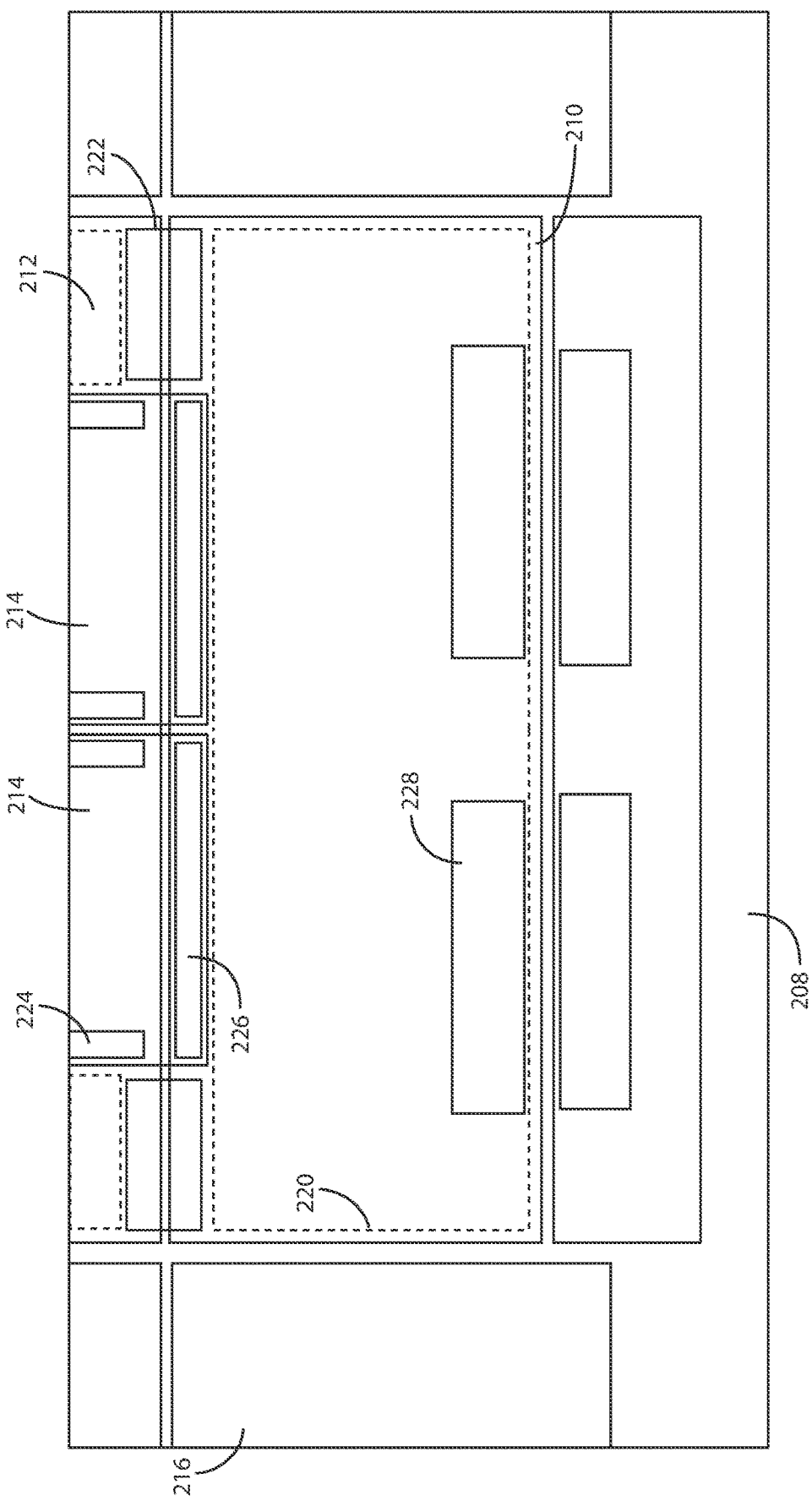
FIG. 2 shows a detail view of a processor module according to an exemplary embodiment.

Referring to FIG. 2, a detail view of a processor module according to an exemplary embodiment is shown. The processor module includes a plurality of interposers 210, 212 comprising an interposer layer, each interposer 210, 212 in electronic communication with a mother interposer 208 (e.g., an electrical interface for routing signals between sockets or connections, including between other interposers 210, 212) via bump mounts 228. One or more processing cores 214 are disposed above the interposer layer and connected to one or more interposers 210, 212 via hybrid copper bonds 224, 226.

In at least one embodiment, a processing core 214 may connect to a first interposer 210 via a first set of hybrid copper bonds 224 and to a second interposer 212 via a second set of hybrid copper bonds 226. The processing core 214 may thereby directly send and receive signals to and from each interposer 210, 212, and any device connected to one of the interposers 210, 212. Alternatively, or in addition, the processor module may include one or more interposer bridges 222 (an electrical interface for routing signals between interposers 210, 212) having hybrid copper bonds to two or more interposers 210, 212 to establish an electronic connection between the two interposers 210, 212 without stitching. In at least one embodiment, a fill die may include vias and circuitry to implement the function of the interposer bridge 222.

Figure 3A:
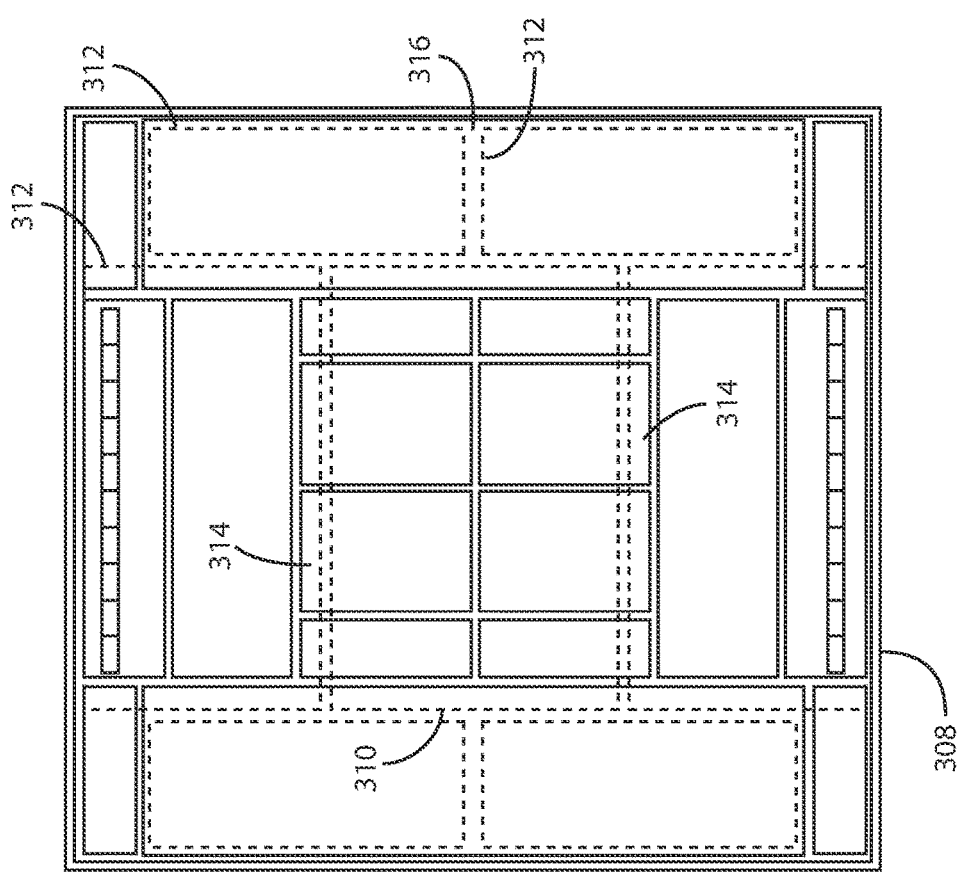
FIG. 3A shows a top view of a processor module according to an exemplary embodiment.
Figure 3B:
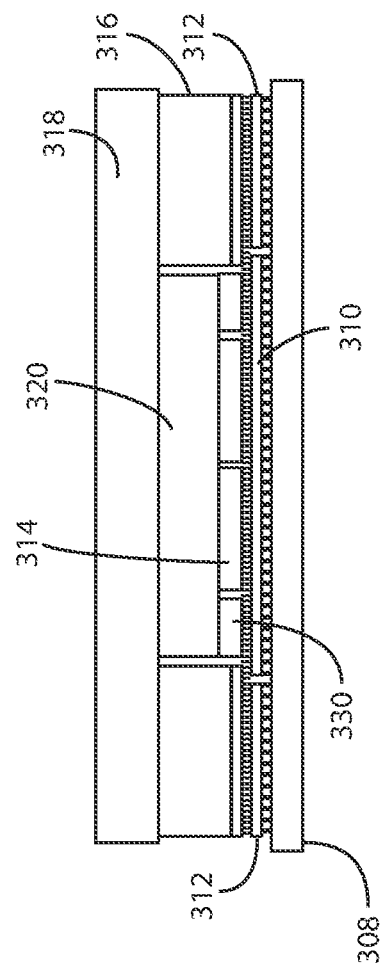
FIG. 3B shows a front cross-sectional view of the processor module in FIG. 3A.
Figure 3C:
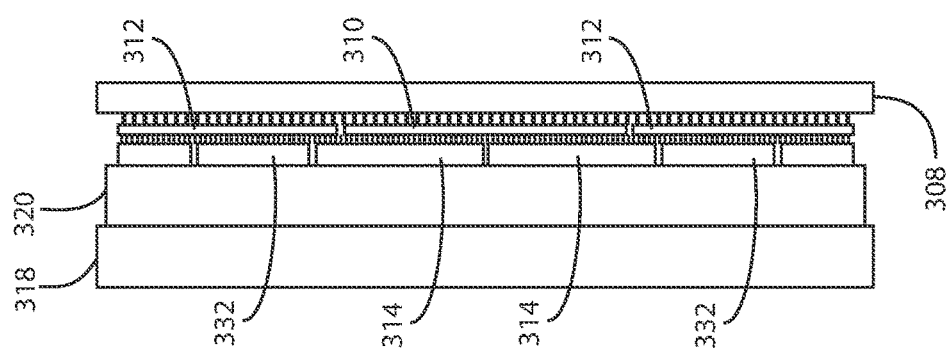
FIG. 3C shows a side cross-sectional view of the processor module in FIG. 3A.

Referring to FIGS. 3A-3C, top and cross-sectional views of a processor module according to an exemplary embodiment are shown. A front cross-sectional view shown in FIG. 3B is defined along a first plane 302 and a side cross-sectional view shown in FIG. 3C is define along a second plane 304. The processor module includes interposers 310, 312 that form an interposer layer, each having a lower surface adapted for bump mounting and an upper surface adapted for copper bonding. Interposers 310, 312 may be bump mounted to a mother interposer 308 that may be a pitch and manufacturing scale suitable for thicker, larger area dies to support a plurality of thinner dies.

In at least one embodiment, interposers 310, 312 in the interposer layer are disposed such that processing cores 314 or memory elements 316 or both overlap portions of more than one interposer 310, 312. For example, a processing core 314 may be primarily disposed above a first interposer 310, 312 while overlapping a second interposer 310, 312 along at least one edge. Each of the first and second interposer 310, 312 is copper bonded to the corresponding processing core 314. The processing core 314 is in electronic communication with both interposers 310, 312, and the interposers 310, 312 are in electronic communication with each other via the processing core 314. Likewise, memory elements 316 (e.g., SRAM, DRAM, SDR SDRAM, DDR SDRAM, DDR2, DDR3, DDR4, GDDR SDRAM, GDDR2-5, SONOS, PROM, EEPROM, and the like) may be primarily disposed above the second interposer 310, 312 while overlapping the first interposer 310, 312 along at least one edge.

In at least one embodiment, the interposer layer comprises passive interposers 310 that provide power and signal connectivity between components, and active interposers 312 that also include some logic circuitry. Processor modules may be limited by the amount of heat they can dissipate. Both processing cores 314 and active interposers 312 produce heat as a waste product of the electronic operations of their corresponding logic circuitry. Heat dissipation in processor modules is facilitated by blank dies 318, 320 disposed to carry heat from active components to a heat sink. In at least one embodiment, a space above an active interposer 312 may include an active component 330, 332 with some logic circuitry. In such embodiment, the logic circuitry is designed such that the heat production of the logic circuitry and corresponding active interposer 312 per unit area remains below the predefined threshold.

Figure 4A:
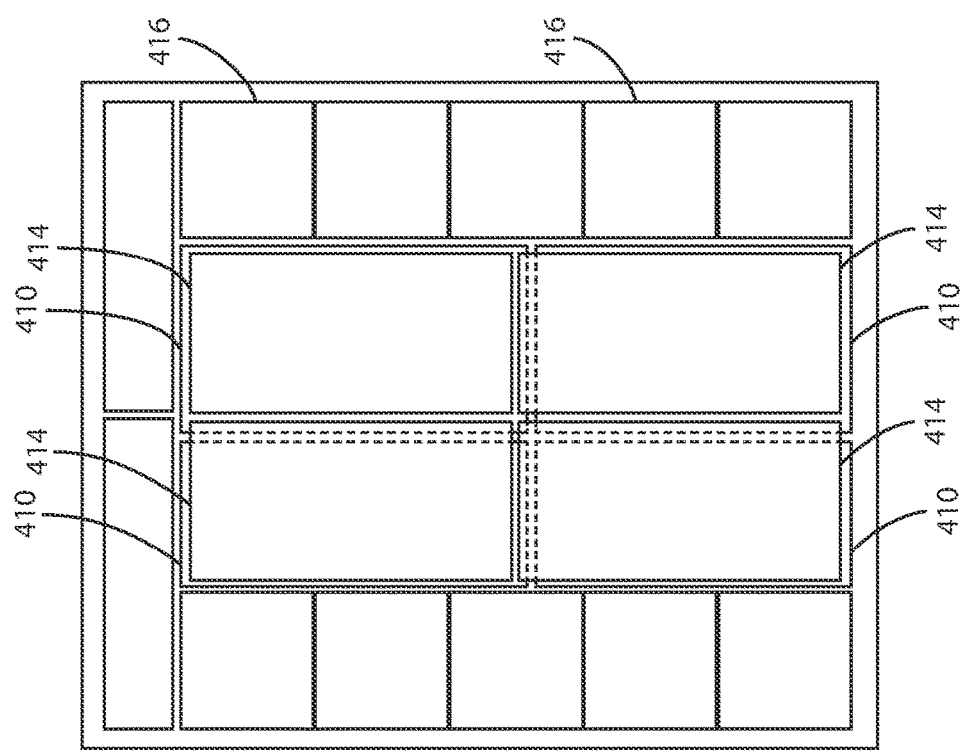
FIG. 4A shows a top view of a processor module according to an exemplary embodiment.
Figure 4B:
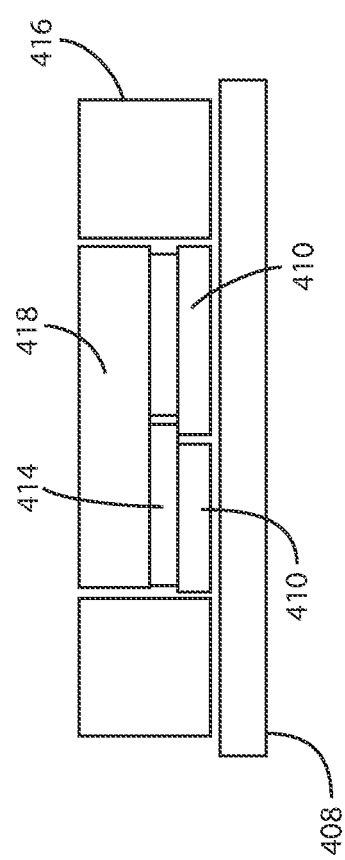
FIG. 4B shows a front cross-sectional view of the processor module in FIG. 4A.

Referring to FIGS. 4A-4B, top and cross-sectional views of a processor module according to an exemplary embodiment are shown. The processor module includes interposers 410 that form an interposer layer, each having a lower surface adapted for bump mounting and an upper surface adapted for copper bonding. Interposers 410 may be bump mounted to a mother interposer 408 to support a plurality of thinner dies.

In at least one embodiment, interposers 410 (an electrical interface for routing signals between sockets or connections, including between other interposers 410) in the interposer layer are offset from corresponding processing cores 414 such that at least one processing core 414 may be primarily disposed above a first interposer 410 while overlapping a second interposer 410 along at least one edge. Each of the first and second interposer 410 is copper bonded to the corresponding processing cores 414. The processing core 414 is in electronic communication with both interposers 410 and the interposers 410 are in electronic communication with each other via the processing cores 414. Overlapping edges between the interposers 410 and processing cores 414 creates an electronically continuous processing core/interposer structure. In at least one embodiment, the processing core 414 has electronic connectivity to one or more memory elements 416 via the interposers 410 and the mother interposer 408.

Overlapping components may enable processor modules of a larger scale than currently possible. Eventually, such scaling may be limited by mechanical expansion mismatch and warpage. An organic interposer or an organic printed circuit board, above a certain size, has essentially the thermal coefficient of expansion of silicon, which is much less than any organic structures. Such limitations may be addressed with a substrate of engineered glass that is designed for minimal thermal expansion.

Reduced die sizes increase yields, and specific areas of both the upper tier die and the interposer may be optimized by using dies optionally manufactured for a specific purpose in that area. For example, the upper tier die could be partitioned to implement different functions in process nodes most suited to the task, while the interposer might be partitioned into passive and active regions. Note that in some cases, functions could be migrated from the upper tier into a section of active interposer, such that some areas of the upper tier do not need to be fully populated with active circuitry—in such cases, the unused upper tier locations could be replaced by blank fill die.

Figure 5A:
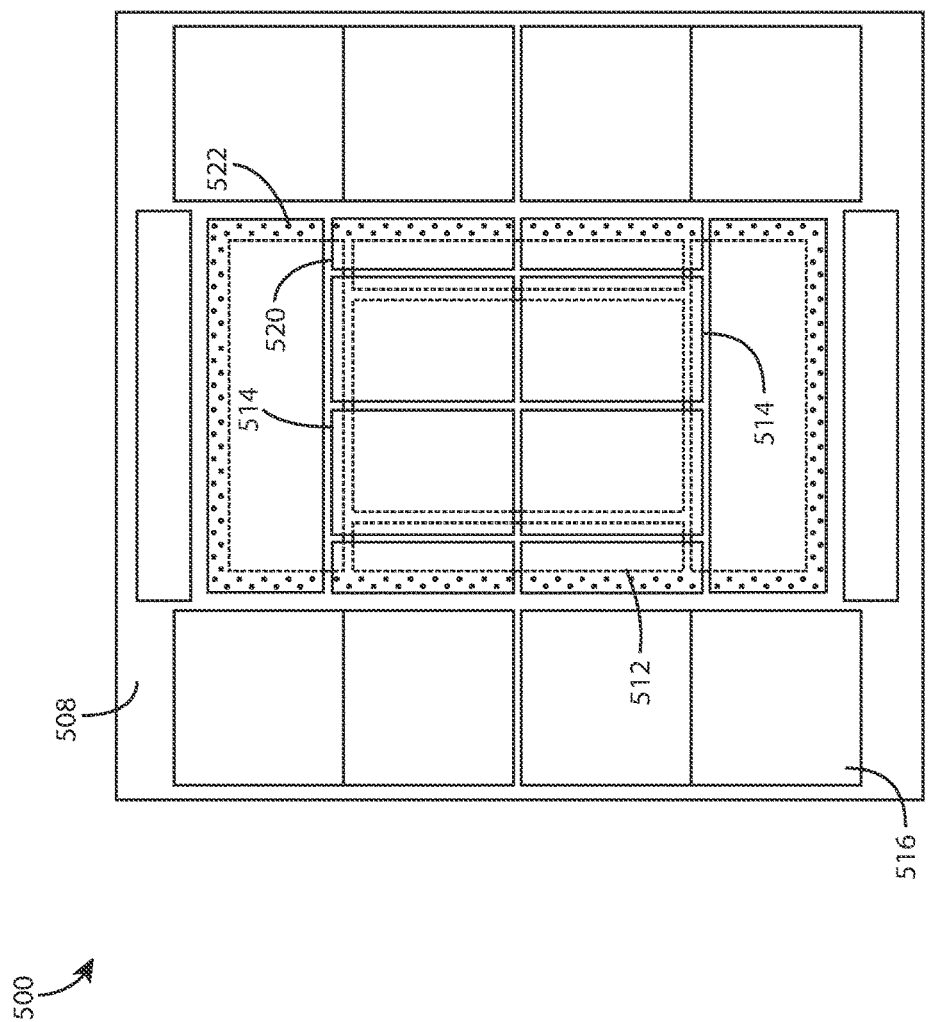
FIG. 5A shows a top view of a processor module according to an exemplary embodiment.
Figure 5B:
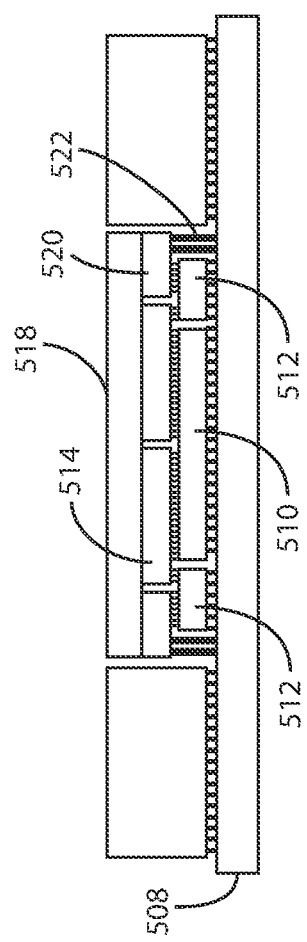
FIG. 5B shows a front cross-sectional view of the processor module in FIG. 5A.

Referring to FIGS. 5A-5B, top and cross-sectional views of a processor module 500 according to an exemplary embodiment are shown. The processor module 500 includes interposers 510, 512 that form an interposer layer, each having a lower surface adapted for bump mounting and an upper surface adapted for copper bonding. Interposers 510, 512 may be bump mounted to a mother interposer 508 to support a plurality of thinner dies. The interposers 510, 512 in the interposer layer provide connectivity to corresponding processing cores 514 and one or more frame dies 520 that may include some active circuitry.

In at least one embodiment, the frame dies 520 may be copper bonded to a corresponding interposer 510, 512 at an overlap between the interposer 510, 512 and the frame die 520. Furthermore, the frame dies 520 may be directly connected to the mother interposer 508 or some other substrate (e.g., engineered glass, a silicon die, other dielectric material, or the like) via a plurality of vias 522; for example, through-dielectric-vias. Vias 522 enable some power and data connectivity to bypass the interposers 510, 512. In at least one embodiment, the processing cores 514 have electronic connectivity to one or more memory elements (416, 516) via the interposers 510, 512 and the mother interposer 508.

The frame dies 520 may comprise high-power dies. Vias 522 according to exemplary embodiments allow all high-power dies (e.g., active dies with processing logic) to be placed in top tier against blank dies 518 disposed to carry heat from active components to a heat sink, or against a heat sink directly. Overlapping lower tiers provides dense die-to-die connectivity for the top tier, and allows data connections, possibly with bypass capacitance.

The lower tier dies (e.g., the interposers 510, 512) may be entirely passive (electronic routing to allow transmission of signals and/or power without logic functions) or include some low power active functions. For example, vias 522 disposed around the perimeter of the lower tier dies may allow I/O signals to transit with lower parasitics compared to routing through lower tier.

Embodiments of the present disclosure enable partitioning a single, large silicon interposer into an array of interposer dies, with the partition lines within the interposer offset from chip boundaries of the upper tier of dies, so that each interposer section overlaps multiple upper tier dies. After copper bonding the array of upper tier dies onto the array of interposer dies, the two tiers of dies (active on top and interposer sections on the bottom) are joined into a single unit, with dense vertical copper interconnections in the overlapping regions. All the die boundaries of the top die are bridged by interposer sections, providing die-to-die connections for the upper tier dies. The size of the structure can conceptually be extended indefinitely without the limitations of reticle dimensions, and without the need to use stitching (mechanical and electronic edge connections) across reticle boundaries.

Embodiments of the present disclosure are useful for processor modules that require highly interconnected, densely packed dies. Exemplary applications include artificial intelligence and high-performance computing, central integrated-circuit computational processors surrounded by on-module, high-bandwidth memory and optional chiplets for off-module I/O. Embodiments facilitate scale-up of the capabilities of such modules to increase the densely-connected processor area. Scaling up enhances the inherent computational capacity, and increases the processor perimeter to mate with increasing amounts of on-die memory and off-module I/O die. Copper-bonded interposers allow for specialization of the interposer structure by area to optimize certain functions.

It is believed that the inventive concepts disclosed herein and many of their attendant advantages will be understood by the foregoing description of embodiments of the inventive concepts, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The forms herein before described being merely explanatory embodiments thereof, it is the intention of the following claims to encompass and include such changes. Furthermore, any of the features disclosed in relation to any of the individual embodiments may be incorporated into any other embodiment.

What is claimed is:

1. An integrated circuit comprising:
   one or more processing cores;
   at least two interposers each of the at least two interposers comprising a first surface adapted for bump mounting and a second surface adapted for hybrid copper bonding; and
   an interposer bridge;
   wherein:
   a processing core of the one or more processing cores is in electronic communication with the second surface of a first interposer and the second surface of a second interposer in the at least two interposers, the interposer bridge in electronic communication with the first interposer and the second interposer.

2. The integrated circuit of claim 1, further comprising at least one memory element, the at least one memory element in electronic communication with the first interposer.

3. The integrated circuit of claim 1, wherein the first interposer comprises an active interposer and the second interposer comprises a passive interposer.

4. The integrated circuit of claim 3, wherein the first interposer and second interposer are disposed beneath the processing core, wherein the processing core is offset from the first interposer and second interposer such that the processing core overlaps the second interposer more than the first interposer.

5. The integrated circuit of claim 1, wherein:
   each of the one or more processing cores are hybrid copper bonded to each second surface of the at least two interposers; and
   each first surface of each of the at least two interposers is bump mounted to a mother interposer.

6. The integrated circuit of claim 3, further comprising at least one active component disposed above and in electronic communication with the first interposer.

7. The integrated circuit of claim 1, further comprising:
   at least one die in electronic communication with the second surface of at least one interposer in the at least two interposers; and
   a plurality of vias disposed between the at least one die and a substrate, wherein one or more of the plurality of vias is configured to bypass the at least two interposers and carry signals from the at least one dies to the substrate.

8. An interposer layer comprising:
at least two interposers, each of the at least two interposers comprising a first surface adapted for bump mounting and a second surface adapted for copper-to-copper bonding, and
an interposer bridge;
wherein:
  a first interposer comprises an active interposer and a second interposer comprises a passive interposer, the interposer bridge being in electronic communication with the first interposer and the second interposer.

9. The interposer layer of claim 8, further comprising a mother interposer in electronic communication with the at least two interposers via the first surface of the corresponding interposer.

10. The interposer layer of claim 8, wherein the second surface of each interposer is adapted for hybrid copper bonding.

11. A processor comprising:
one or more processing cores;
at least two interposers each of the at least two interposers comprising a first surface adapted for bump mounting and a second surface adapted for hybrid copper bonding; and
an interposer bridge,
wherein:
  a processing core of the one or more processing cores is in electronic communication with the second surface of a first interposer and the second surface of a second interposer in the at least two interposers, the interposer bridge being in electronic communication with the first interposer and the second interposer.

12. The processor of claim 11, further comprising at least one memory element, the at least one memory element in electronic communication with the first interposer.

13. The processor of claim 11, wherein the first interposer comprises an active interposer and the second interposer comprises a passive interposer.

14. The processor of claim 13, wherein the first interposer and second interposer are disposed beneath the processing core, wherein the processing core is offset from the first interposer and second interposer such that the processing core overlaps the second interposer more than the first interposer.

15. The processor of claim 11, wherein:
each of the one or more processing cores are hybrid copper bonded to each second surface of the at least two interposers; and
each first surface of each of the at least two interposers is bump mounted to a mother interposer.

16. The integrated circuit of claim 13, further comprising at least one active component disposed above and in electronic communication with the first interposer.

17. The processor of claim 11, further comprising:
at least one die in electronic communication with the second surface of at least one interposer in the at least two interposers; and
a plurality of vias disposed between the at least one die and a substrate, wherein the plurality of vias is configured to bypass the at least two interposers and carry signals from the at least one dies to the substrate.

* * * * *